(12) United States Patent
Sakakibara

(10) Patent No.: US 7,415,688 B2
(45) Date of Patent: Aug. 19, 2008

(54) METHOD OF MANUFACTURING SURFACE-EMITTING BACKLIGHT, BY MOLDING CONTACT MEMBER INTEGRALLY WITH MOLDED CASE

(75) Inventor: Yasufumi Sakakibara, Tokyo (JP)

(73) Assignee: Ryoden Trading Company, Limited, Tokyo (JP)

( * ) Notice: Subject to any disclaimer, the term of this patent is extended or adjusted under 35 U.S.C. 154(b) by 87 days.

(21) Appl. No.: 11/349,937

(22) Filed: Feb. 9, 2006

(65) Prior Publication Data

US 2006/0124955 A1 Jun. 15, 2006

Related U.S. Application Data

(62) Division of application No. 09/950,592, filed on Sep. 13, 2001, now Pat. No. 7,024,765.

(30) Foreign Application Priority Data

Sep. 13, 2000 (JP) ............................. 2000-278104

(51) Int. Cl.
*G06F 17/50* (2006.01)

(52) U.S. Cl. .......................................... 716/12; 716/15
(58) Field of Classification Search ...................... 716/1, 716/10–14
See application file for complete search history.

(56) References Cited

U.S. PATENT DOCUMENTS

| 6,018,167 A * | 1/2000 | Oota ............................. 257/99 |
| 6,221,696 B1 | 4/2001 | Crema et al. |
| 6,274,890 B1 * | 8/2001 | Oshio et al. .................... 257/98 |
| 6,626,554 B2 * | 9/2003 | Rincover et al. ............ 362/186 |

* cited by examiner

*Primary Examiner*—Jack Chiang
*Assistant Examiner*—Binh C Tat
(74) *Attorney, Agent, or Firm*—Young & Thompson

(57) ABSTRACT

A method of manufacturing a surface-emitting backlight is provided with the steps of forming a lead frame and resin-made molded case by insert molding, attaching light sources, which are red, blue and green LED dies, to contacts of the lead frame provided in a hollow space of the molded case, forming a light guide section by filling the hollow space with a transparent or semitransparent resin, and thereafter attaching a reflector sheet, and lens sheets (or diffuser sheets) in accordance with the applications of the backlight.

4 Claims, 15 Drawing Sheets

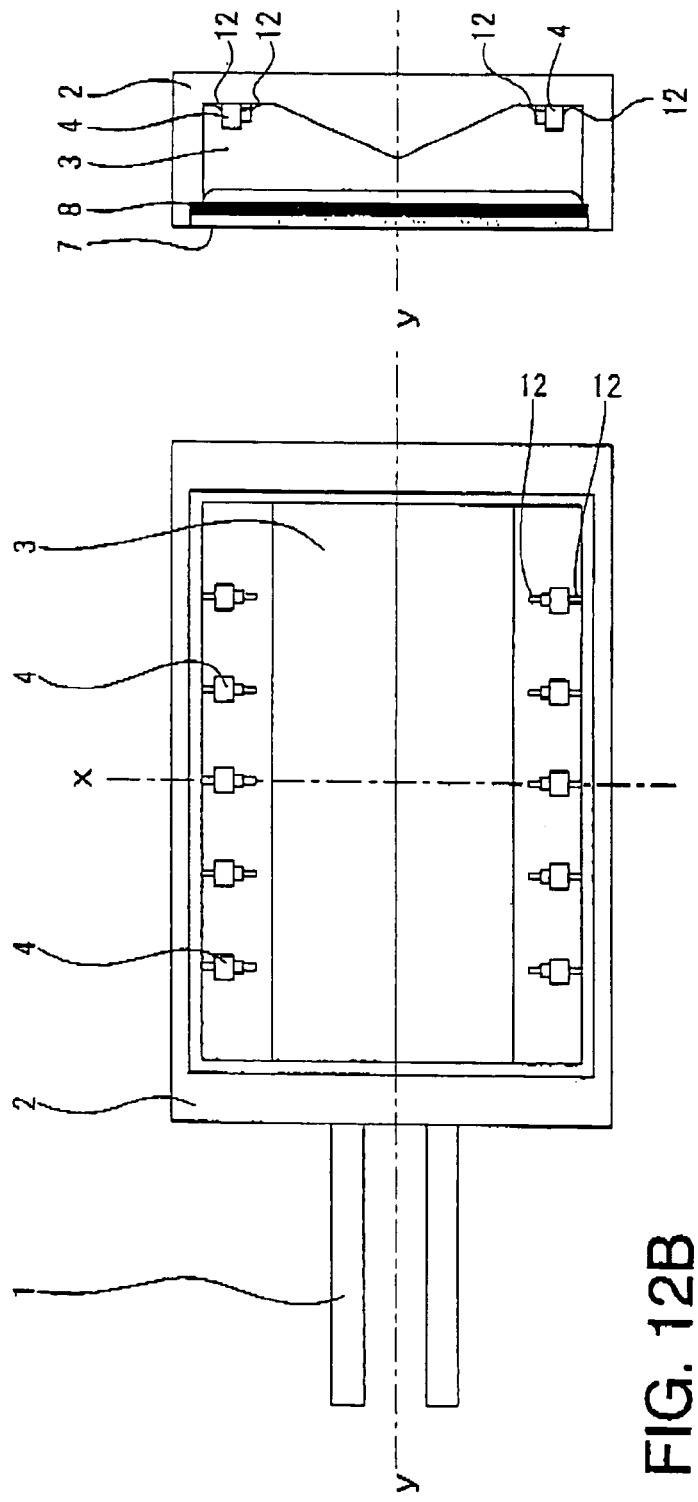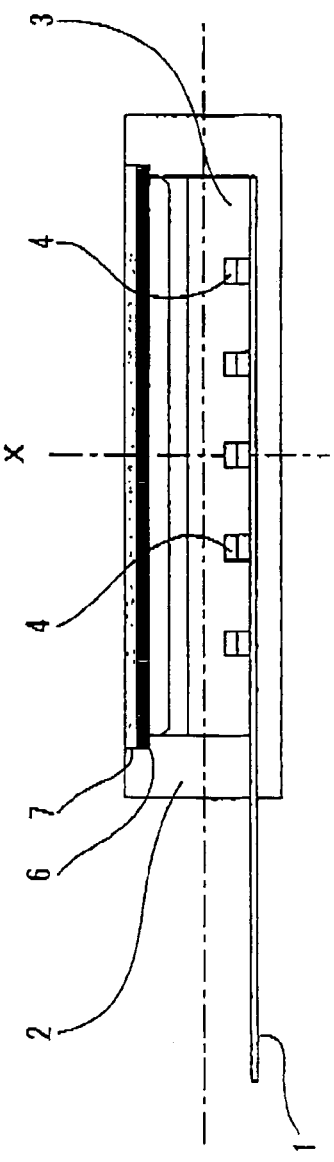
FIG. 12A
FIG. 12B
FIG. 12C

METHOD OF MANUFACTURING SURFACE-EMITTING BACKLIGHT, BY MOLDING CONTACT MEMBER INTEGRALLY WITH MOLDED CASE

BACKGROUND OF THE INVENTION

1. Field of the Invention

The present invention relates to a method of manufacturing a surface-emitting backlight and a surface-emitting backlight manufactured by the method.

2. Description of Related Art

Conventional surface-emitting backlights used for liquid crystal displays, etc. is comprised of a light source, a transparent resin plate (light guide plate) for guiding light from the light source, a lower plate, a diffuser sheet or lens sheet, and an upper case. As the light source, an LED unit in which chip LEDs are attached to a board is used.

According to a conventional manufacturing method, the light guide plate, case, light source, and board of the light source are prepared as independent parts, and are assembled manually into the finished product.

However, according to this conventional method, in the case of a side-edge-type backlight that causes the light source to emit light horizontally with respect to its emissive surface, the upper case must have a certain thickness to allow the light source board to be attached to its side wall, and from this arises a problem that there is a limit to realizing smaller and thinner backlight.

Further, the chip LED has a narrow angle of radiation of light. Thus, in the case of an underneath-type-backlight that causes the light source to emit light vertically with respect to their emissive surface, a large area must be secured in their emissive surface for radiation of light. This requires the underneath-type-backlight to give a certain length to the optical path between the lower surface of the case to the emissive surface, hence making it difficult to implement smaller and thinner backlight.

Still further, the components of these backlights, which are manufactured and conveyed as independent parts, are susceptible to mechanical damage during conveyance and contamination with dust during assembly.

Even further, small liquid crystal displays use small backlights. Thus, manual assembly of the parts of such small backlights is extremely difficult to perform, hence imposing a problem that operating efficiency is impaired.

Especially, the conventional technique of attaching the light source board to the upper case requires that signal lines for supplying power to the light source be soldered to the board, and this operation is extremely cumbersome.

SUMMARY OF THE INVENTION

It is, therefore, an object of the present invention to provide a method of manufacturing a surface-emitting backlight which is so simple in structure that its manufacturing process can be simplified and that its size and thickness can be reduced, as well as such a surface-emitting backlight manufactured by the method.

The above object of the present invention can be achieved by a method of manufacturing a surface-emitting backlight of the present invention, is provided with the processes of: molding a contact member for contact with emissive means integrally with a molded case made of a resin and provided with a hollow space having at least one inner surface serving as a reflective surface, such that conductive contacts of said contact member are exposed to an interior of said hollow space; arranging said emissive means on at least one of said conductive contacts; and covering said interior of said hollow space with light guide means substantially evenly.

According to the present invention, each process can be automated, thereby improving operating efficiency In one aspect of the present invention, said process of molding a contact member with emissive means is a process of burying said contact member into said molded case by insert molding.

According to this aspect, each process can be automated, thereby improving operating efficiency In another aspect of the present invention, said process of covering said interior of said hollow space with light guide means is a process of filling said hollow space with a transparent or semitransparent resin.

According to this aspect, the process of covering the interior of the hollow space with the light guide means substantially evenly is a process of filling the hollow space with a transparent or semitransparent resin, whereby this step can be automated, and operating efficiency is hence improved.

In further aspect of the present invention, said process of arranging said emissive means is a process of attaching at least one light-emitting semiconductor die as said emissive means to said at least one of said conductive contacts.

According to this aspect, the process of arranging the emissive means one at least one of the conductive contacts is a process of attaching at least one light-emitting semiconductor die as the emissive means to the at least one of the conductive contacts, whereby this step can be automated, and operating efficiency is hence improved.

In further aspect of the present invention, the method is further provided with a process of roughening said at least one inner surface of said hollow space of said molded case for diffusion of light during or after said process of molding said contact member for contact with emissive means integrally with said molded case.

According to this aspect, the process of roughening at least one inner surface of the-hollow space of the molded case is performed for diffusion of light, during or after the process of molding the contact member for contact with the emissive means integrally with the molded case, whereby a surface-emitting backlight capable of efficient radiation of light from its emissive surface can be easily manufactured through automation.

The above object of the present invention can be achieved by a surface-emitting backlight of the present invention. The backlight is provided with: a molded case made of a resin and provided with a hollow space having at least one inner surface serving as a reflective surface; a contact member for contact with emissive means integrally molded with said molded case such that conductive contacts of said contact member are exposed to an interior of said hollow space; emissive means arranged on at least one of said conductive contacts; and light guide means for covering said interior of said hollow space substantially evenly.

According to the present invention, the molded case and the contact member are integrally molded, the emissive means is directly arranged on the at least one of the conductive contacts within the hollow space of the integrally molded case, and the light guide means covers the recess substantially evenly, whereby the surface-emitting backlight uses a smaller number of parts, and hence can be smaller and thinner in structure than conventional backlights.

In one aspect of the present invention, said light guide means is a transparent or diffusing-material-containing semitransparent resin.

According to the invention, the light guide means is a transparent or diffusing-material-containing semitransparent resin, whereby light can be radiated from the emissive surface efficiently.

In another aspect of the present invention, said hollow space is provided with a roughened surface for diffusion, as said at least one inner surface.

According to this aspect, the hollow space is provided with a roughened surface diffusion, as the at least one inner surface, whereby light rays can be diffused uniformly for efficient radiation from the emissive surface.

In further aspect of the present invention, said emissive means is arranged so as to emit light in a direction vertical to an emissive surface of said surface-emitting backlight.

According to this aspect, the emissive means is arranged so as to emit light in a direction vertical to the emissive surface of the surface-emitting backlight, whereby the intensity of the backlight can be easily improved.

In further aspect of the present invention, said emissive means is arranged at one or both ends of an emissive region of said emissive surface, and wherein reflecting means for reflecting light from said emissive means to a substantially entire area of said emissive region is arranged above said emissive means.

According to this aspect, the emissive means is arranged at one or both end of an emissive region of the emissive surface, and the reflecting means for reflecting light from the emissive means to a substantially entire area of the emissive region is arranged above the emissive means, whereby even if the light is emitted in a direction vertical to the emissive surface of the surface-emitting backlight, the light from the emissive means can be reflected satisfactorily over the entire area of the emissive region.

In further aspect of the present invention, said emissive means is arranged so as to emit light in a direction horizontal to an emissive surface of said surface-emitting backlight.

According to this aspect, the emissive means is arranged so as to emit light in a direction horizontal to. an emissive surface of the surface-emitting backlight, whereby emitting efficiency can be improved.

In further aspect of the present invention, said emissive means is a light-emitting semiconductor die.

According to this aspect, the emissive means is a light-emitting semiconductor die, whereby the surface-emitting backlight can be made smaller and thinner than conventional backlights.

In further aspect of the present invention, a plurality of emissive means of different colors are arranged on said at least one of said conductive contacts.

According to this aspect, a plurality of emissive means of different colors are arranged on the at least one of the conductive contacts, whereby the degree of freedom is increased in adjusting the intensity of light and chromaticity balance.

BRIEF DESCRIPTION OF THE DRAWINGS

FIG. 12A is a plan view showing a sixth variation of where and how many light sources are attached in the surface-emitting backlight according to the embodiment of the invention, FIG. 12B is a sectional view taken along a line y-y of FIG. 12A, and. FIG. 12C is a sectional view taken along a line x-x of FIG. 12A;

DETAILED DESCRIPTION OF THE PREFERRED EMBODIMENTS

The present invention will now be described with reference to preferred embodiments shown in the accompanying drawings.

Figure 1:
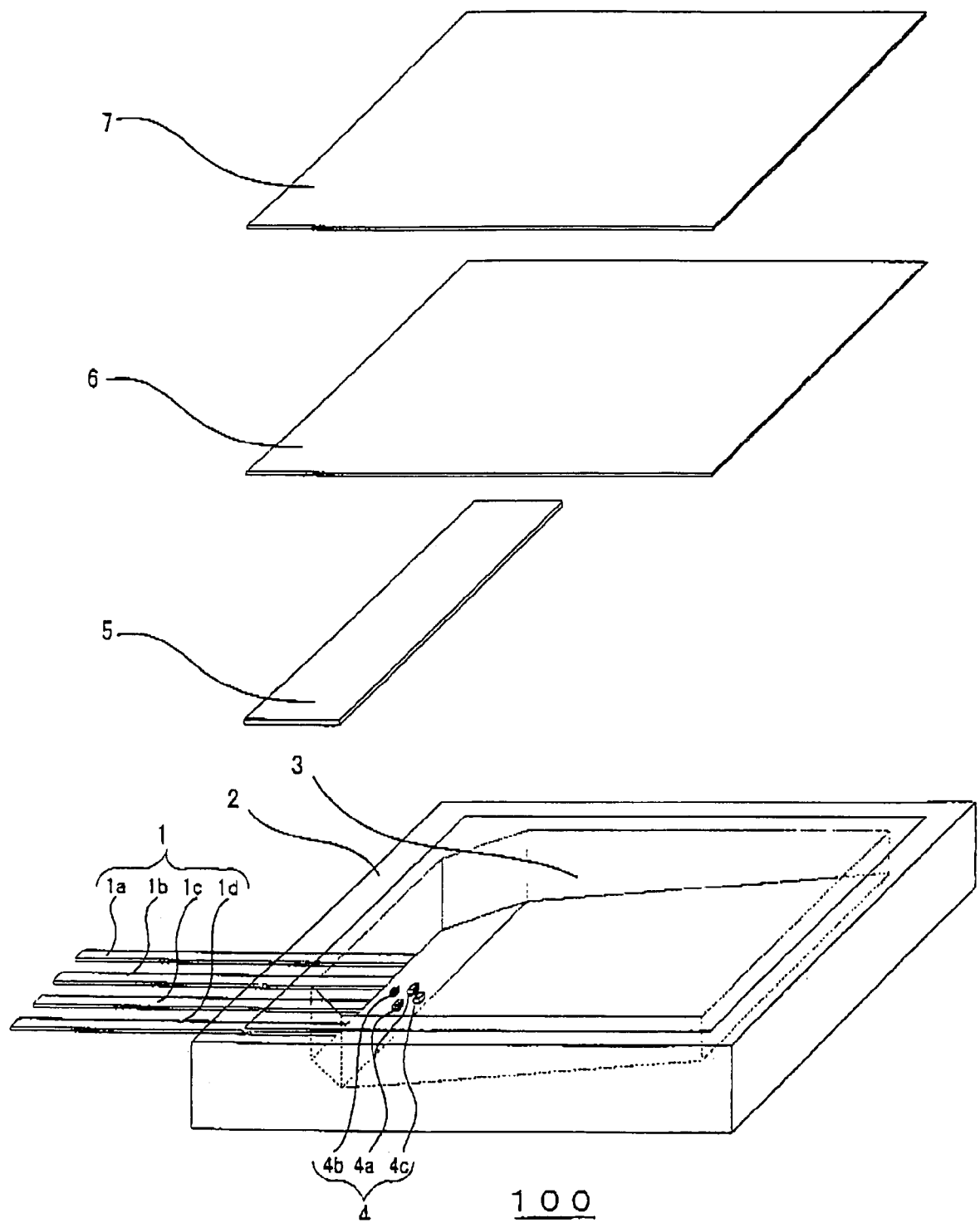
FIG. 1 is an exploded view showing the general construction of a surface-emitting backlight according to an embodiment of the present invention.
Figure 2A:
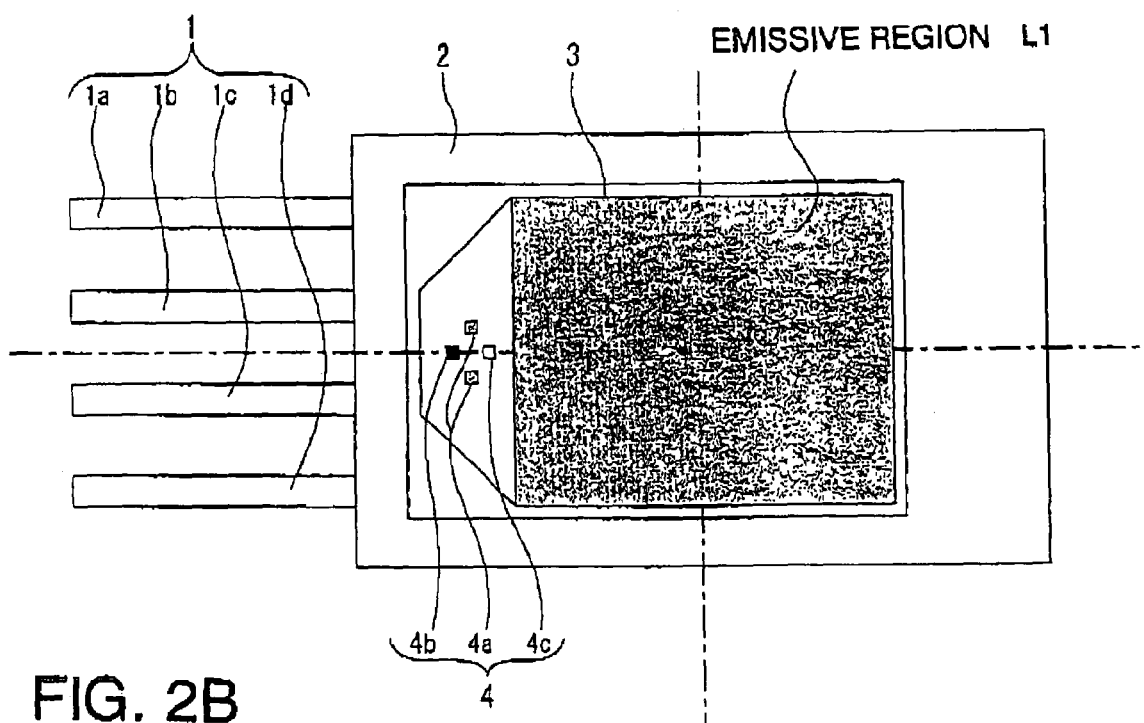
FIGS. 2A and 2B are a plan view and a sectional view respectively showing the general construction of the surface-emitting backlight according to the embodiment of the invention.
Figure 2B:
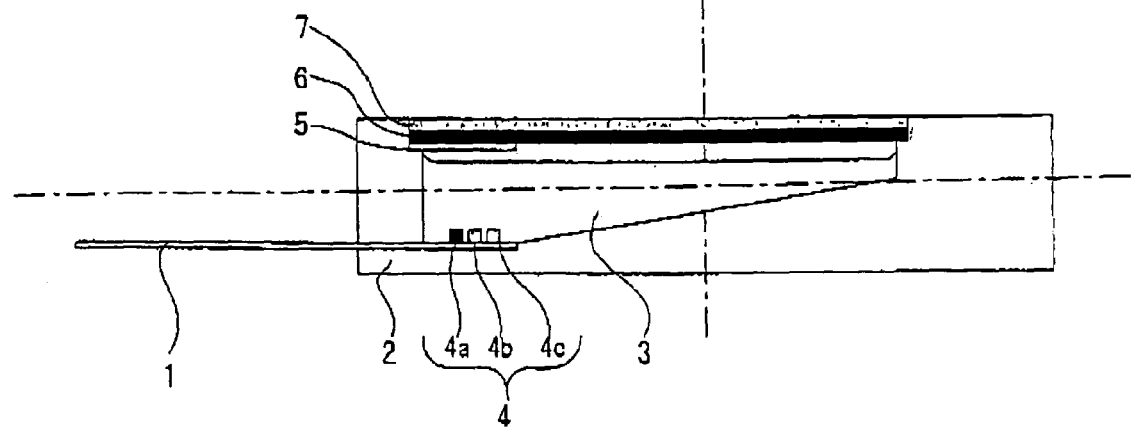

Referring to FIGS. 1, 2A and 2B, a backlight 100 according to an embodiment of the invention is comprised of a lead frame 1, a molded case 2, a light guide section 3, light sources 4, a reflector sheet 5, a first lens sheet (or a diffuser sheet) 6, and a second lens sheet (or a diffuser sheet) 7.

Figure 3:
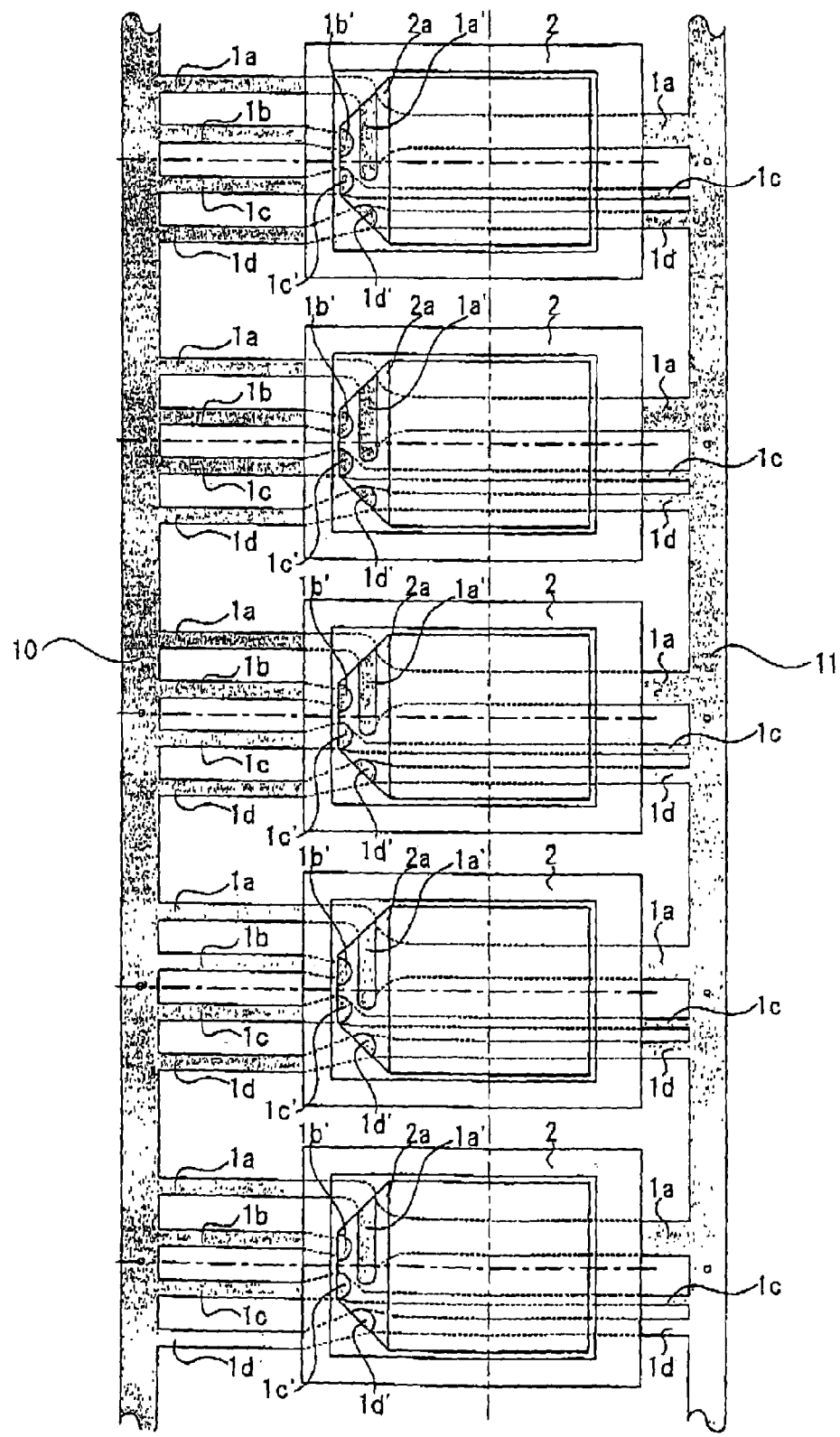
FIG. 3 is a diagram showing an example of the construction of a lead frame and a molded case of the surface-emitting backlight according to the embodiment of the invention.
Figure 4:
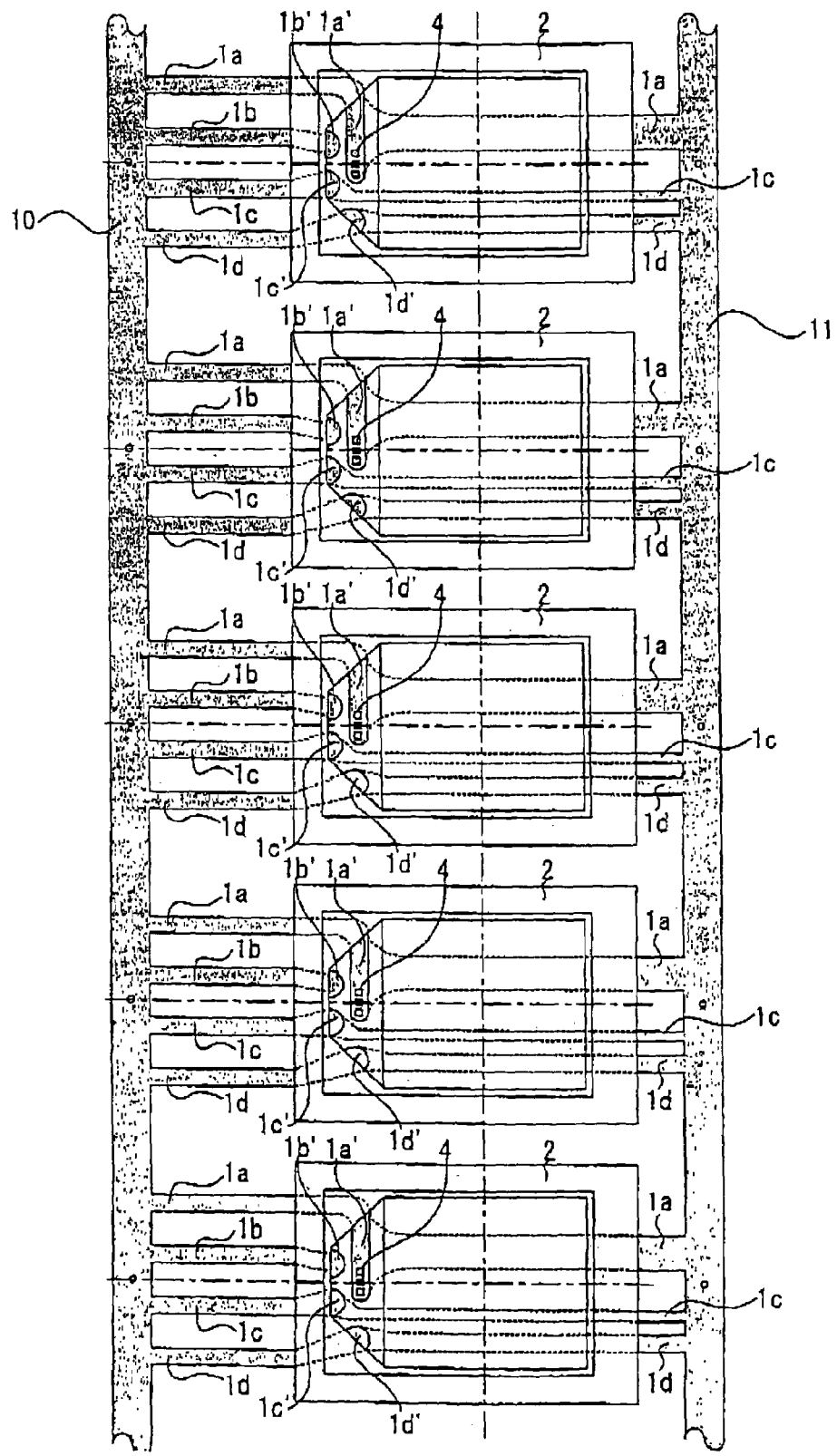
FIG. 4 is a diagram illustrating an example of how light sources are attached to the molded case of FIG. 3.

The lead frame 1 as a contact member is made of metal, such as copper or gold. In this embodiment, the lead frame 1 includes a first lead frame 1a, a second lead frame 1b, a third lead frame 1c, and a fourth lead frame 1d. As shown in FIGS. 3 and 4, the first to fourth lead frames 1a to 1d are formed on one or both support frames 10 and 11. The frames 10 and 11 allow multiple lead frames 1a to 1d to be formed thereon at a time.

The molded case 2 is formed integrally with the lead frame 1 by insert molding. Resins for molding include those having colors that can satisfactorily reflect, e.g., white or pearl light. The case 2 is, as shown in FIG. 1, flat and rectangular in shape with a raised lip along its four sides to provide a hollow space like an empty flat box, and its inner bottom surface is sloped for reflection. Further, as shown in FIG. 3, a light source locating area 2a is arranged such that contacts 1a', 1b', 1c', and 1d' of each lead frame 1 are exposed thereto. FIG. 4 shows an example in which the light sources 4 are attached directly to the contact 1a'.

Figure 5A:
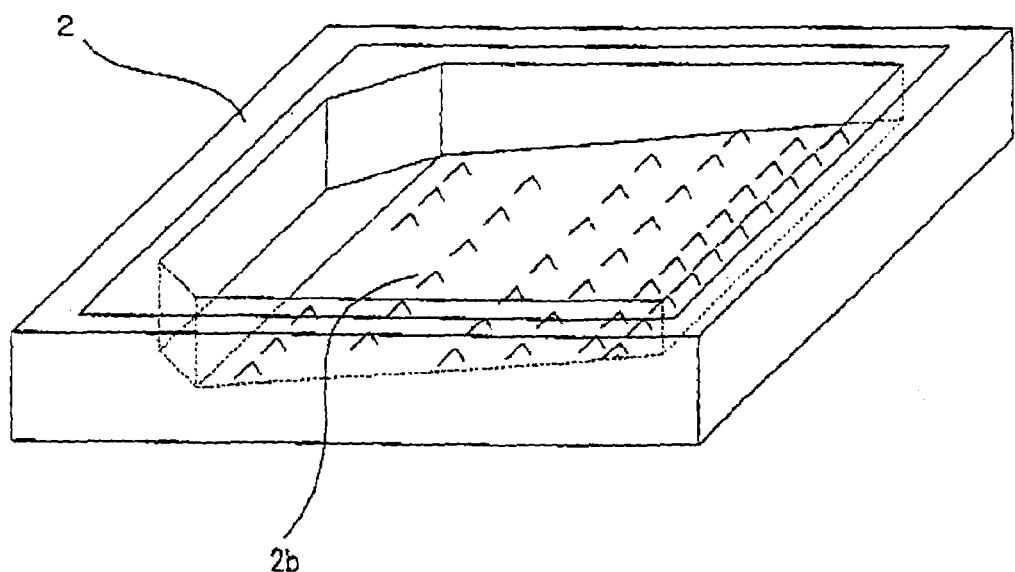
FIG. 5A is a diagram illustrating an example of how an inner bottom surface of the molded case is roughened in the surface-emitting backlight according to the embodiment of the invention.
Figure 5B:
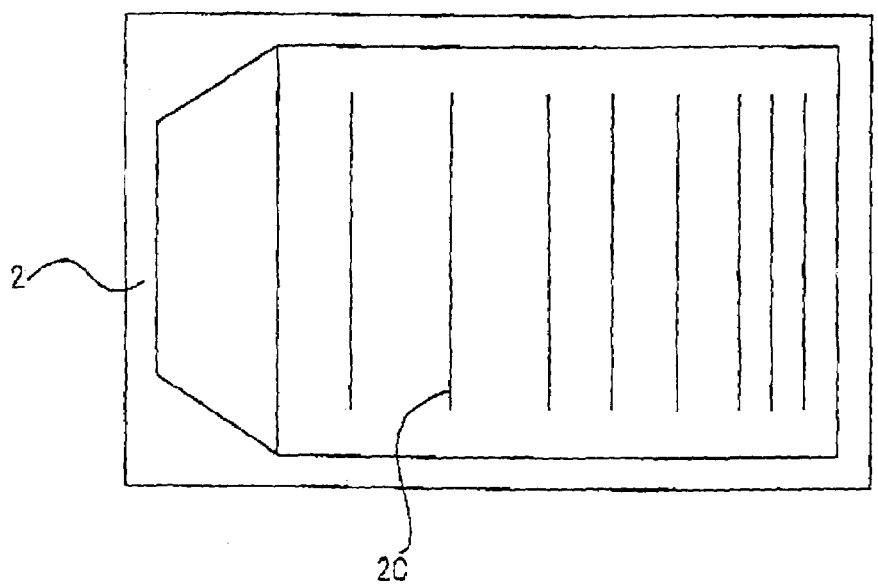
FIG. 5B is a diagram illustrating another example of the same.

Further, as shown in FIG. 5A, the inner bottom surface of the molded case 2 is roughened to have a multitude of protrusions 2b for uniform diffusion of light rays radiated from the light sources. Roughening may be provided in the form of ridge-like projections 2c each being linear as shown in FIG. 5B or curvilinear, for example. Roughening may be performed by means of transfer using a mold, dot printing for frosting, cutting, etc. Further, the surface for roughening is not limited to the inner bottom surface of the case 2, but its inner lateral surfaces may also be roughened together.

The light guide section 3 is formed by locating the light sources 4, e.g., at the contact 1a', performing a necessary bonding step, filling the hollow space of the case 2 with a transparent or semitransparent resin, and thereafter curing the resin. The section 3 may be formed by mounting an already injection-molded light guide plate into the hollow space of the case 2.

Unpackaged LED dies are used as the light sources 4. In this embodiment, two red LED dies 4a, one blue LED die 4b, and one green LED die 4c are used for full color display, as an example. An exemplary full color display method is to operate these color LED dies on a time division basis. Further, in this embodiment, white is produced by operating these dies for mixing of their light rays.

The reflector sheet 5 is designed to guide the light rays from the light sources 4 into the hollow space of the case 2 efficiently. In the backlight 100 according to this embodiment, the upper surface of the molded case 2 serves as an emissive surface (see FIGS. 2A and 2B), and the light sources 4 are arranged at a location near one end of the emissive surface as viewed along the length of the case 2. Further, since the light rays are emitted from the LED dies vertically with respect to the emissive surface, the reflector sheet 5 must be used for efficient reflection of these rays toward an emissive region of the emissive surface (see FIG. 2A).

The first and second lens sheets 6 and 7 serve to increase the intensity of light of the emissive surface. Only one of the lens sheets may be used or these sheets may be omitted, depending on the arrangement, etc. of the light sources 4 and/or the light guide section 3. Further, the lens sheet may be replaced with the diffuser sheet that is employed to improve the uniformity of intensity of light over the emissive region. Thus, a combination of one lens sheet with one diffuser sheet or use of diffuser sheets alone may be feasible. The number of lens sheets or diffuser sheets is not limited, but may be appropriately selectable, depending on the specifications, etc. of a backlight.

Figure 6:
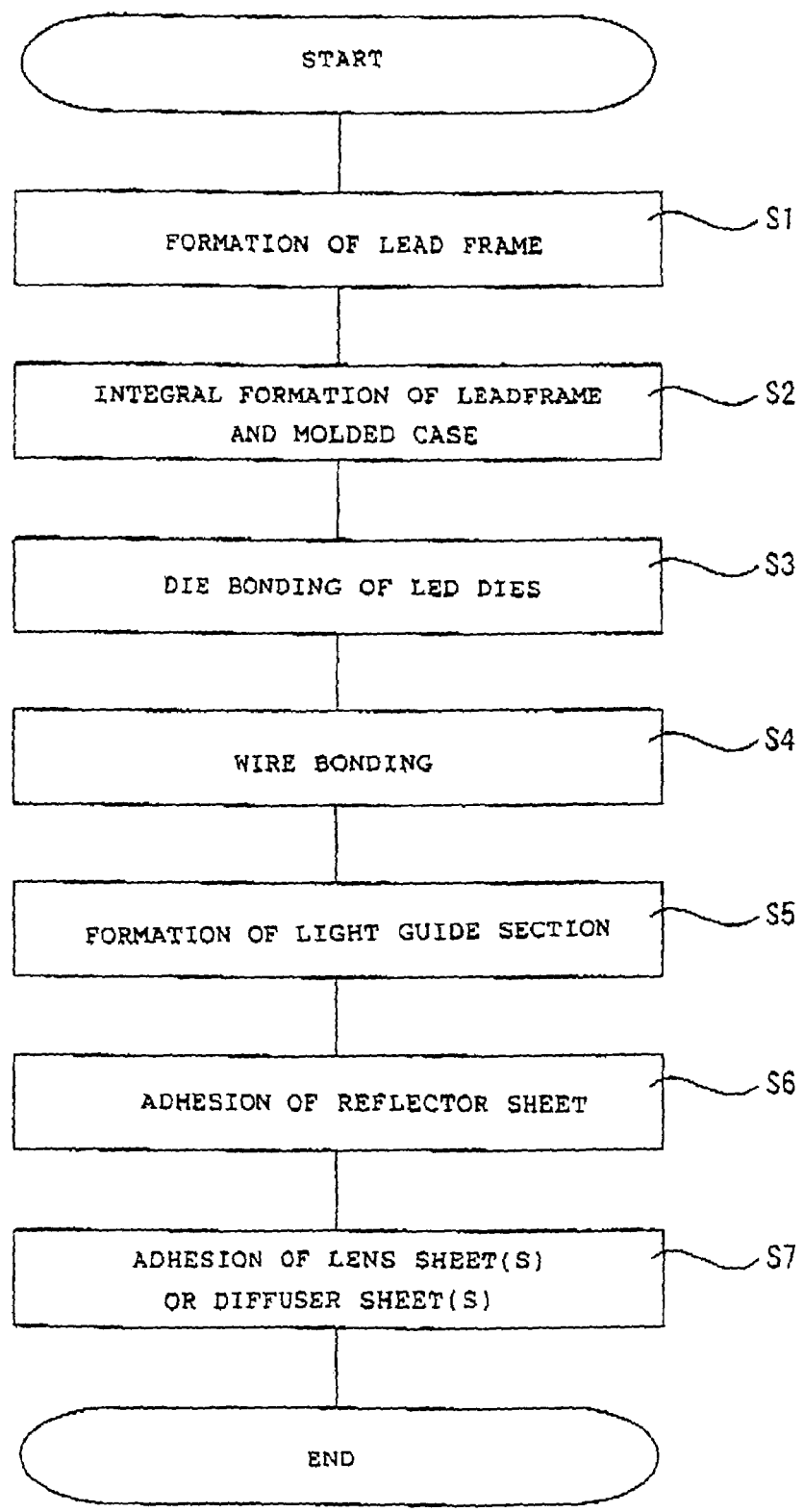
FIG. 6 is a flowchart showing a method of manufacturing the surface-emitting backlight according to the embodiment of the invention.

A method of manufacturing the backlight according to this embodiment will be described next with reference to the flowchart shown in FIG. 6.

First, the lead frame 1 is formed, which is provided with a plurality of lead frames 1a to 1d between the support frames 10 and 11 (Step S1).

Next, while clamping the lead frames 1a to 1d at predetermined locations thereof with a mold, resin is. charged into a cavity formed in the mold, whereby the lead frame 1 and the molded case 2 are integrally molded by insert molding (Step S2). Notice that the above-mentioned types of protrusions are formed during this step S2, since the roughening is performed by means of transfer with a mold in this embodiment. Similarly, other roughening methods including printing can also be performed during this step S2.

Then, the respective color LED dies, which are the light sources 4, are attached to one or more of the contacts of the first to fourth lead frames 1a to 1d which extend into the molded case 2, by die bonding (Step S3).

Subsequently, these color LED dies are electrically connected to the remaining contacts by wire bonding (Step S4).

Then, the transparent or semitransparent resin is filled in a manner burying the entire area of the hollow space of the case 2 to form the light guide section 3 (Step S5).

Next, the reflector sheet 5 is adhered to an upper surface portion of the molded case 2 which corresponds to the area where the light sources 4 are attached (Step S6).

Thereafter, the first and second lens sheets (or the diffuser sheets) 6 and 7 are adhered in a manner covering the top of the case 2 evenly (Step S7).

As described above, according to the method of manufacturing a backlight of the invention, the backlight can be manufactured in an automated process only by preparing its parts, i.e., the lead frame 1, light sources 4, reflector sheet 5, and first and second lens sheets 6 and 7.

Therefore, the method of the invention can achieve a far better operating efficiency than the conventional manufacturing method which involves manual operation for framing the molded case 2, connecting the light source board to leads, attaching the light guide plate, etc. Further, the technique of the invention for forming the light guide section 3 by filling the hollow space of the case 2 with the resin contributes to reliable protection of the section 3 against mechanical damage during conveyance and contamination with dust during manufacturing, which is the problem encountered by the conventional method.

Next, exemplary locations of the light sources 4 will be described for the backlight according to this embodiment.

FIGS. 1, 2A and 2B show the example in which two red, one blue, and one green LED dies are arranged. These dies are arranged at a central location across the width of the molded case 2, at an end-side location along the length of the case 2, and at the deepest location in terms of the depth of the case 2.

In this example, white is produced by operating these color LED dies to mix their light rays. Use of the red, blue, and green LED dies contributes to increasing the intensity of light of the emissive section, and hence the backlight. Further, by using twice as many red LED dies as the number of LED dies of other colors, an ideal chromaticity balance can be maintained, which is requisite for the production of ideal white.

The intensity of a red LED is about half that of a blue or green LED. Thus, when the number of LEDs used is the same per color, the current to be applied to the red LED must be twice that of the blue or green LED. Since a maximum current applicable to the LED is approximately 20 mA, 20 mA is set for the red LED, and 10 mA is set for the blue and green LEDs, for example, in conventional backlights (wherein a contact member module having one each of red, blue, and green LED dies already attached thereto is used). However, since the intensity of the LEDs fluctuates from one die to another, the current applied to each color LED must be adjusted in order to obtain a desired intensity of light. This holds true and hence imposes a serious concern when the current to be applied to the red LED is initially fixed at the maximum current of 20 mA as in the above conventional example. That is, since the maximum current applied to the red LED is fixed and thus unadjustable, only the currents to be applied to the blue and green LEDs must be adjusted. However, such adjustment made only to the blue and green LEDs is not enough to obtain the ideal chromaticity balance requisite for the production of ideal white.

In contrast, in this embodiment wherein unpackaged LED dies are used as the light sources 4, a plurality of LED dies can be attached for each color. If two series-connected red LED dies and one each of blue and green LED dies are arranged, for example, the current to be applied to each of blue and green LED dies can be set to, e.g., 20 mA, and two series-connected red LED dies also can be set to, e.g., 20 mA respectively.

Therefore, the current applied to each LED die can be adjusted within the range of 10-20 mA, for example.

In addition, all of the LED dies can be used at the maximum current of 20 mA, so that the intensity of the backlight can be increased.

Although this is an example in which each color LED die emits light in a direction from the bottom to the top of the molded case 2, there is no need to arrange the LED dies right under the main area of the emissive section of the backlight 100 owing to the presence of the above-mentioned reflector sheet 5 and the slope provided on the inner bottom surface of the case 2 as shown in FIG. 1. In the conventional direct backlights, the LED-attached light source board is required to be arranged on the lower surface of the molded case 2, hence imposing the problem that the backlights become very thick. Unlike such conventional backlights, extremely thin backlights can be realized according to this embodiment.

Figure 7A:
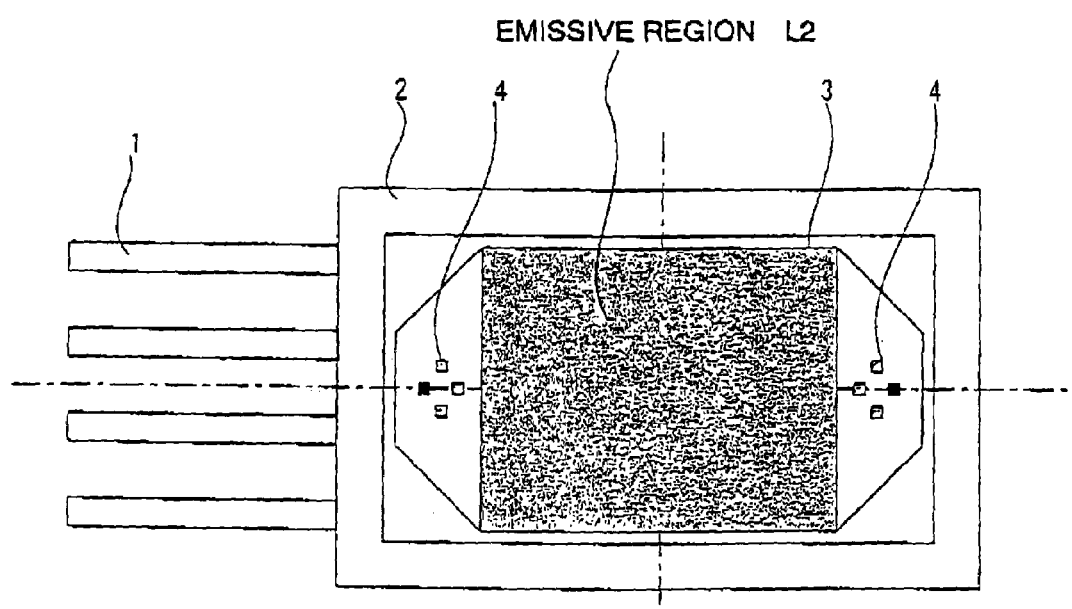
FIG. 7A is a plan view showing a first variation of where and how many light sources are attached in the surface-emitting backlight according to the embodiment of the invention.
Figure 7B:
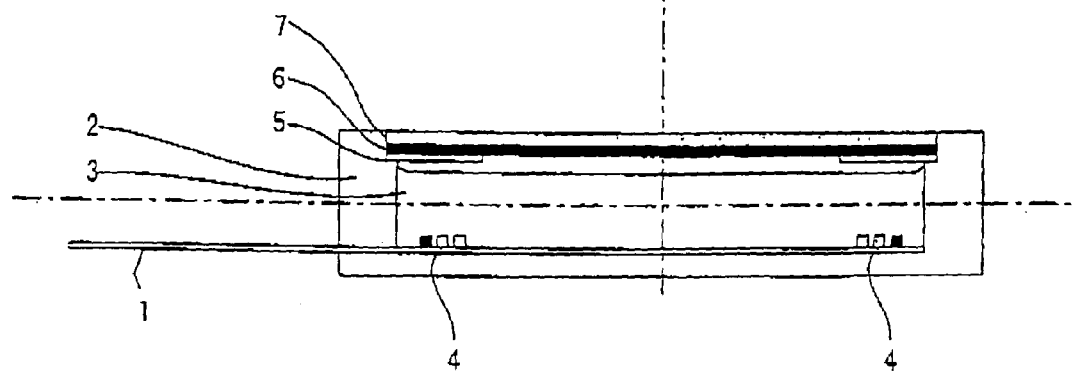
FIG. 7B is a sectional view showing their locations.

Moreover, as shown in FIGS. 7A and 7B, when the color LED dies are arranged at both ends of the molded case 2, a larger emissive region can be obtained. That is, comparing the longitudinal length of an emissive region L1 obtained in the case where the dies are arranged at one end of the case 2 as shown in FIG. 2A with the longitudinal length of an emissive region L2 obtained in the case where the dies are arranged at both ends of the case 2 as shown in FIG. 7A, the latter can double the length of the emissive region.

Figure 8A:
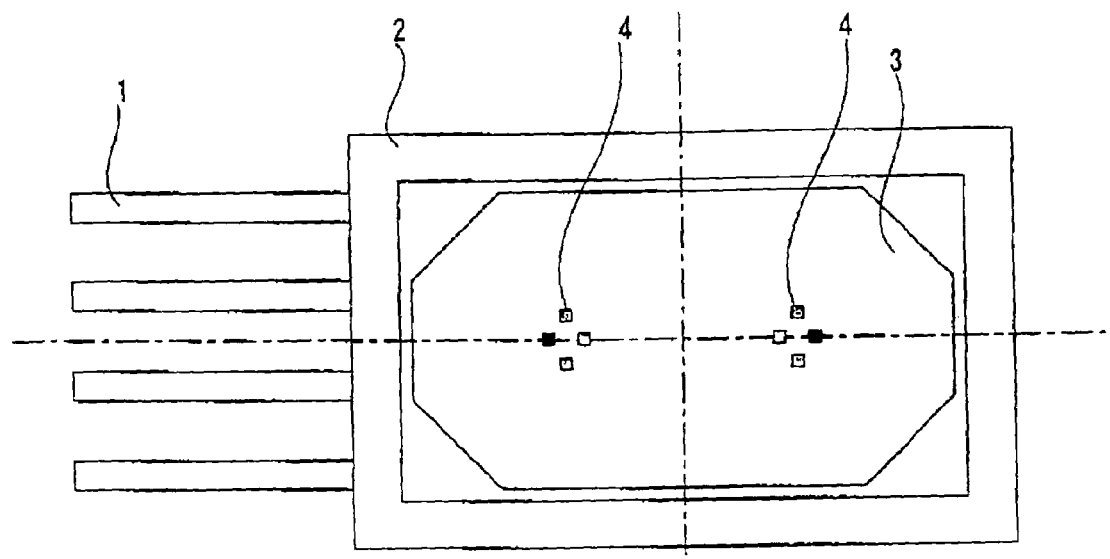
FIG. 8A is a plan view showing a second variation of where and how many light sources are attached in the surface-emitting backlight according to the embodiment of the invention.
Figure 8B:
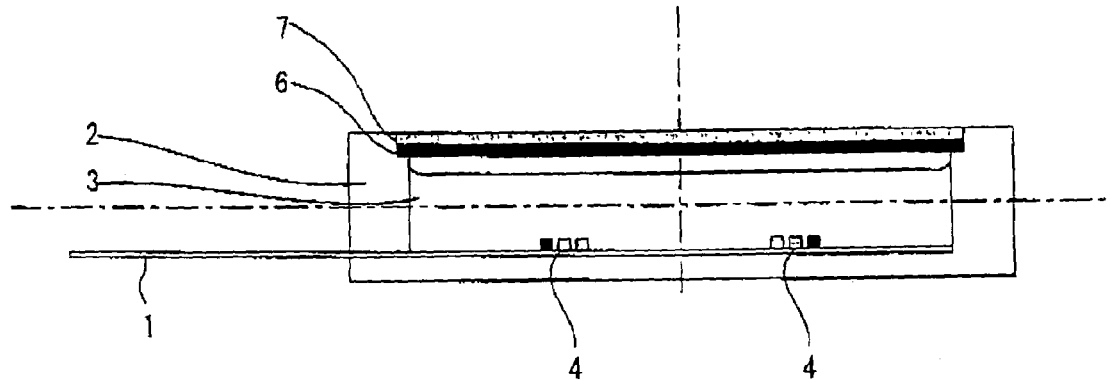
FIG. 8B is a sectional view showing their locations.

Further, the color LED dies may be located toward the center as shown in FIGS. 8A and 8B, in some cases. In such cases, the reflector sheet 5 can be omitted.

Figure 9A:
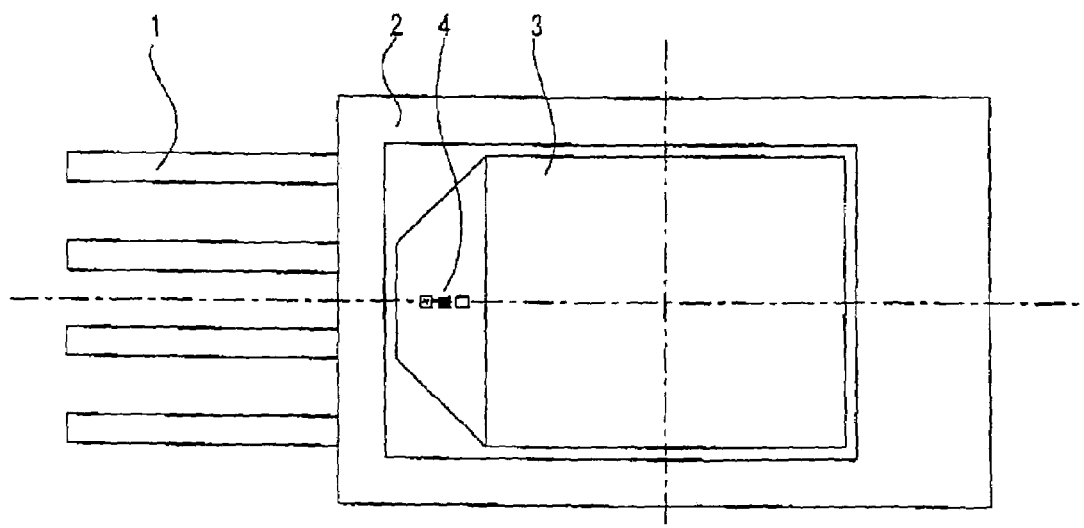
FIG. 9A is a plan view showing a third variation of where and how many light sources are attached in the surface-emitting backlight according to the embodiment of the invention.
Figure 9B:
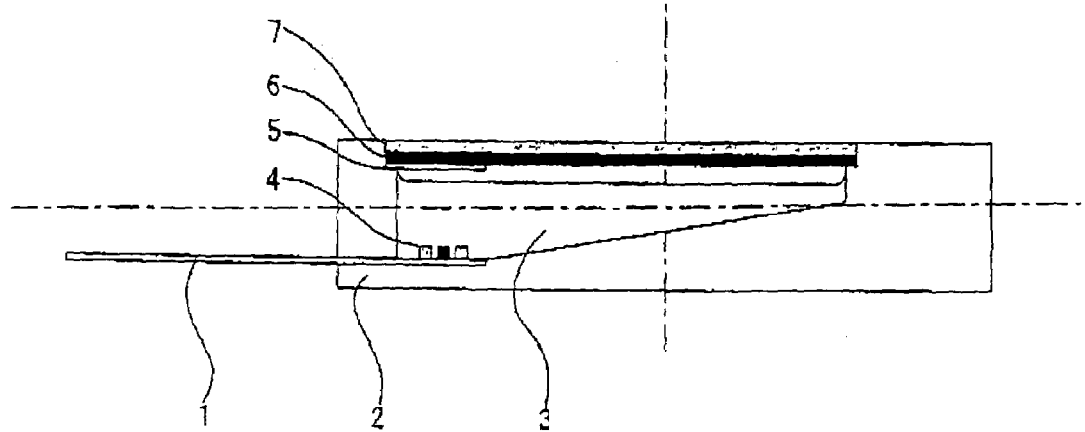
FIG. 9B is a sectional view showing their locations.

Notice that the number of LED dies is not limited to four as in this embodiment, but may be one for each color as shown in FIGS. 9A and 9B, depending on the specifications, etc. of the backlight 100.

Figure 10A:
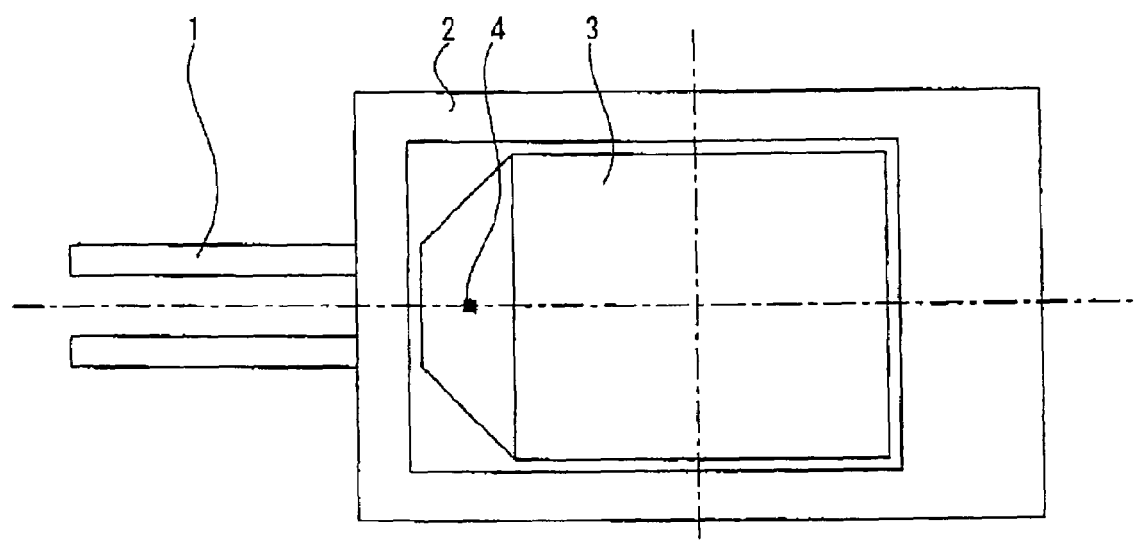
FIG. 10A is a plan view showing a fourth variation of where and how many light sources are attached in the surface-emitting backlight according to the embodiment of the invention.
Figure 10B:
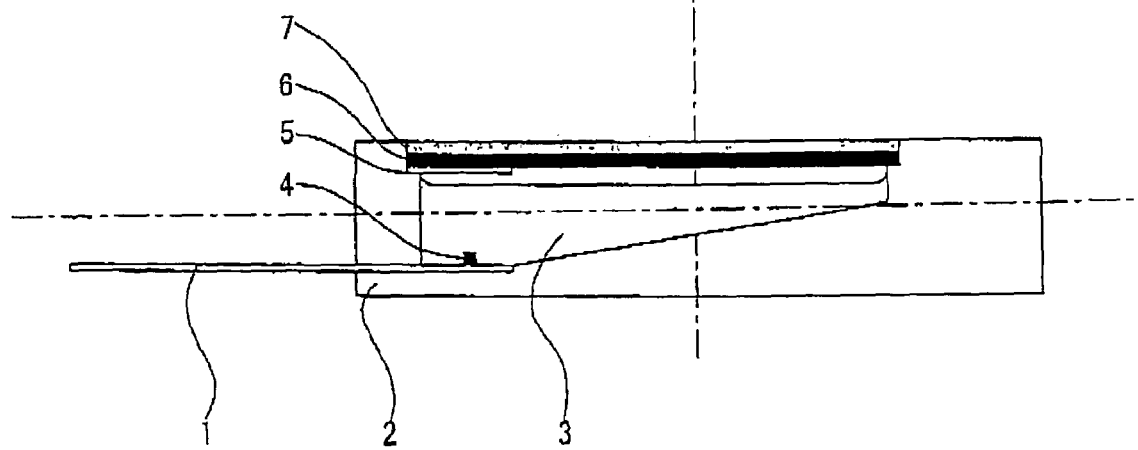
FIG. 10B is a sectional view showing the location of a light source.

Further, only one monochromatic LED die may be attached as shown in FIGS. 10A and 10B.

Figure 11A:
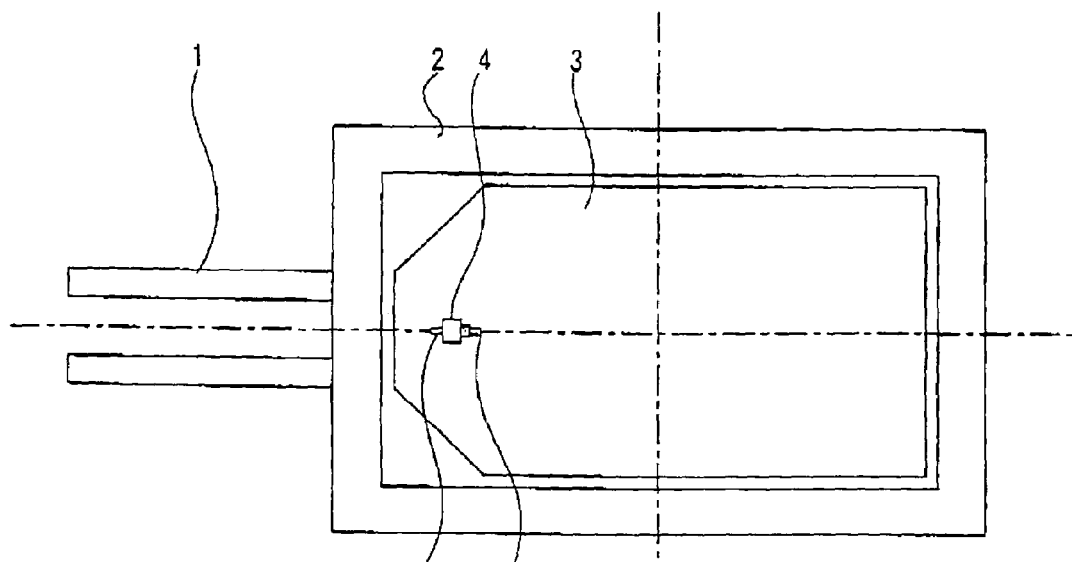
FIG. 11A is a plan view showing a fifth variation of where and how many light sources are attached in the surface-emitting backlight according to the embodiment of the invention.
Figure 11B:
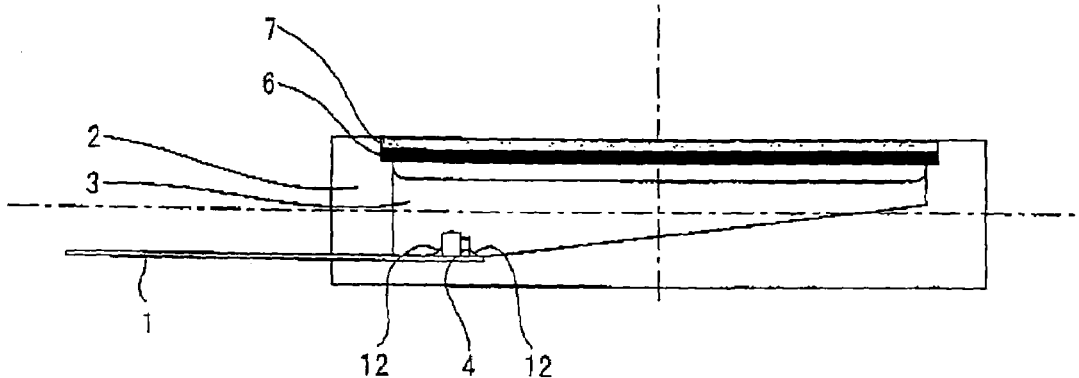
FIG. 11B is a sectional view showing the location of a light source.

Still further, an LED die may be arranged so as to emit light in parallel to the emissive surface of the backlight 100 as shown in FIGS. 11A and 11B. In this case, a so-called bumping step may be performed, by which bumps 12 are formed to attach the LED die as shown in the same figures.

Even further, as shown in FIGS. 12A, 12B, and 12C, a plurality of LED dies arranged to emit light in parallel to the emissive surface of the backlight 100 may be disposed at both ends across the width of the molded case 2 at predetermined intervals along the length of the case 2.

Figure 13:
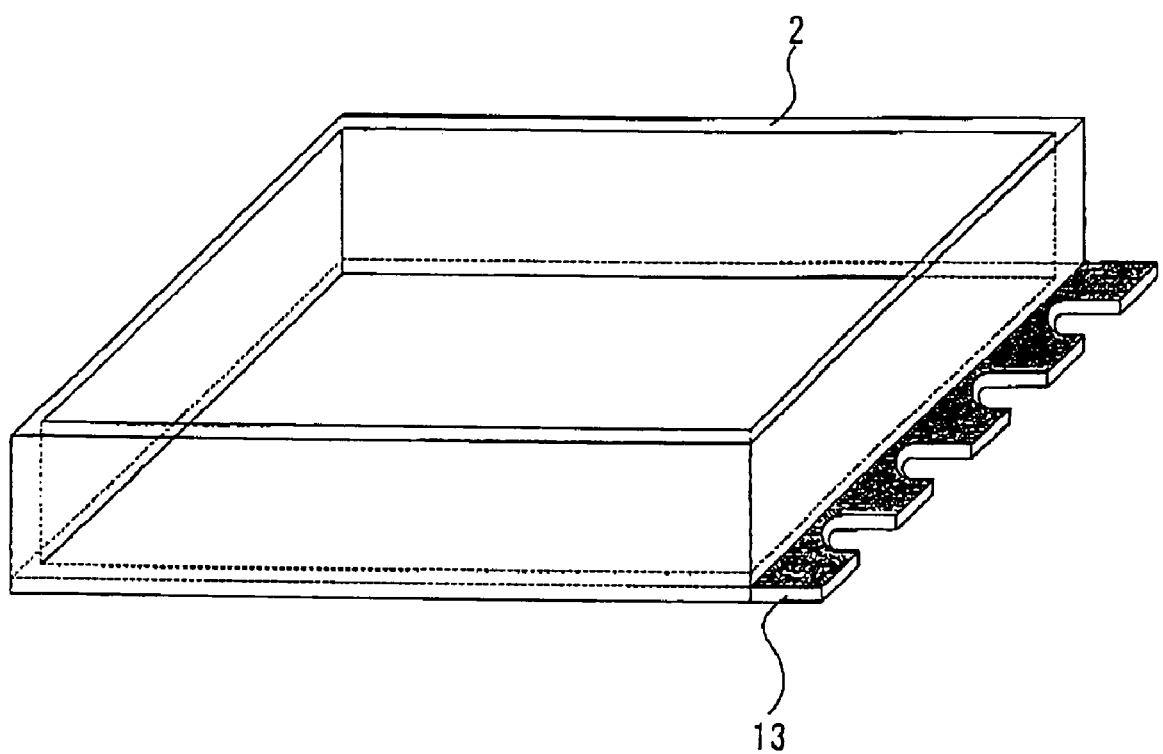
FIG. 13 is a perspective view showing a surface-emitting backlight according to another embodiment of the invention.

Next, another embodiment of the contact member will be described. While the case where the lead frame is used as the contact member has been described in the above examples, the invention is not limited to this. For instance, a printed board 13 may be attached to the molded case 2 as the contact member, as shown in FIG. 13.

According to this construction, the degree of freedom in mounting can be increased. In addition, a multitude of backlights can be produced at a time, as shown in FIGS. 14 and 15, whereby the backlights can be mass-produced easily.

Figure 14:
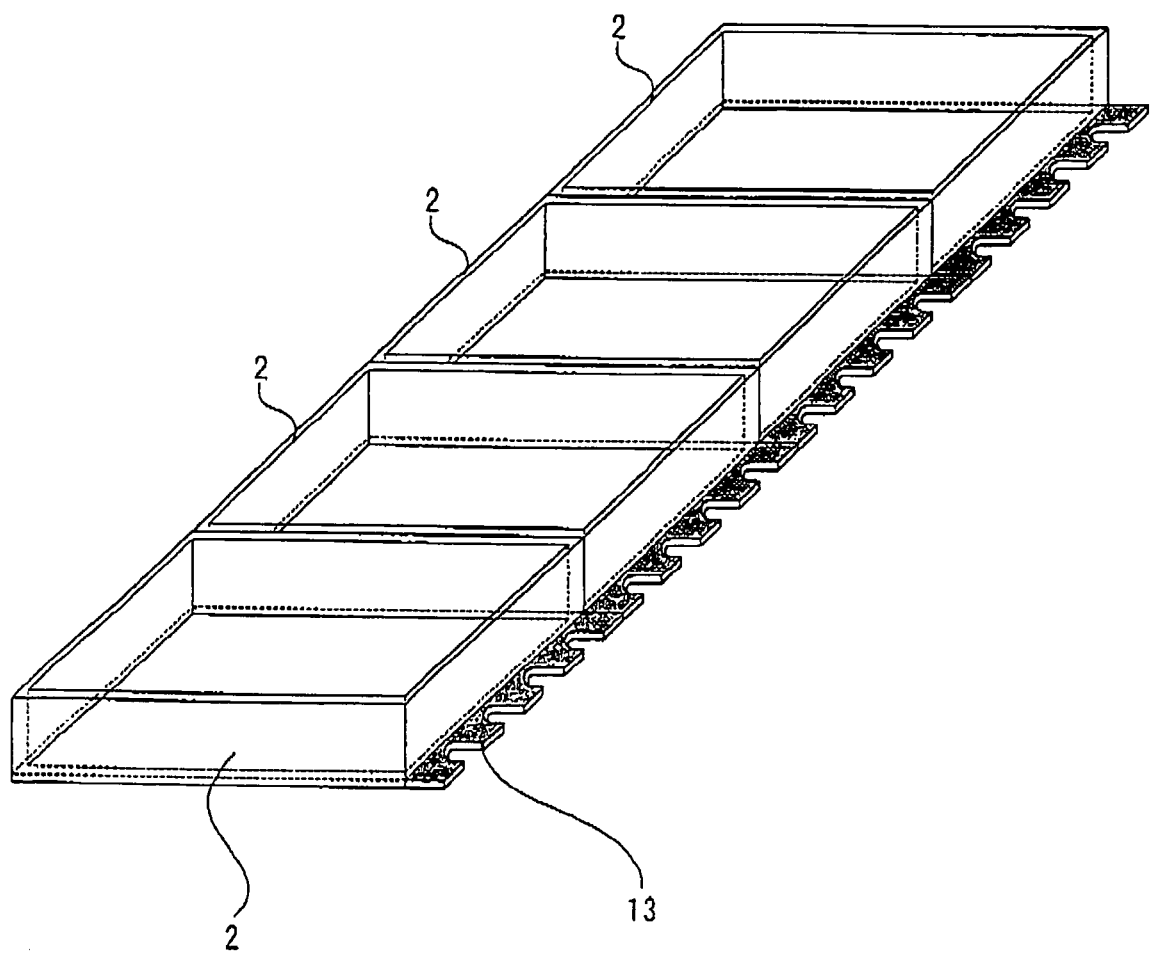
FIG. 14 is a diagram illustrating a first variation of a method of manufacturing the surface-emitting backlight according to such another embodiment of the invention.
Figure 15:
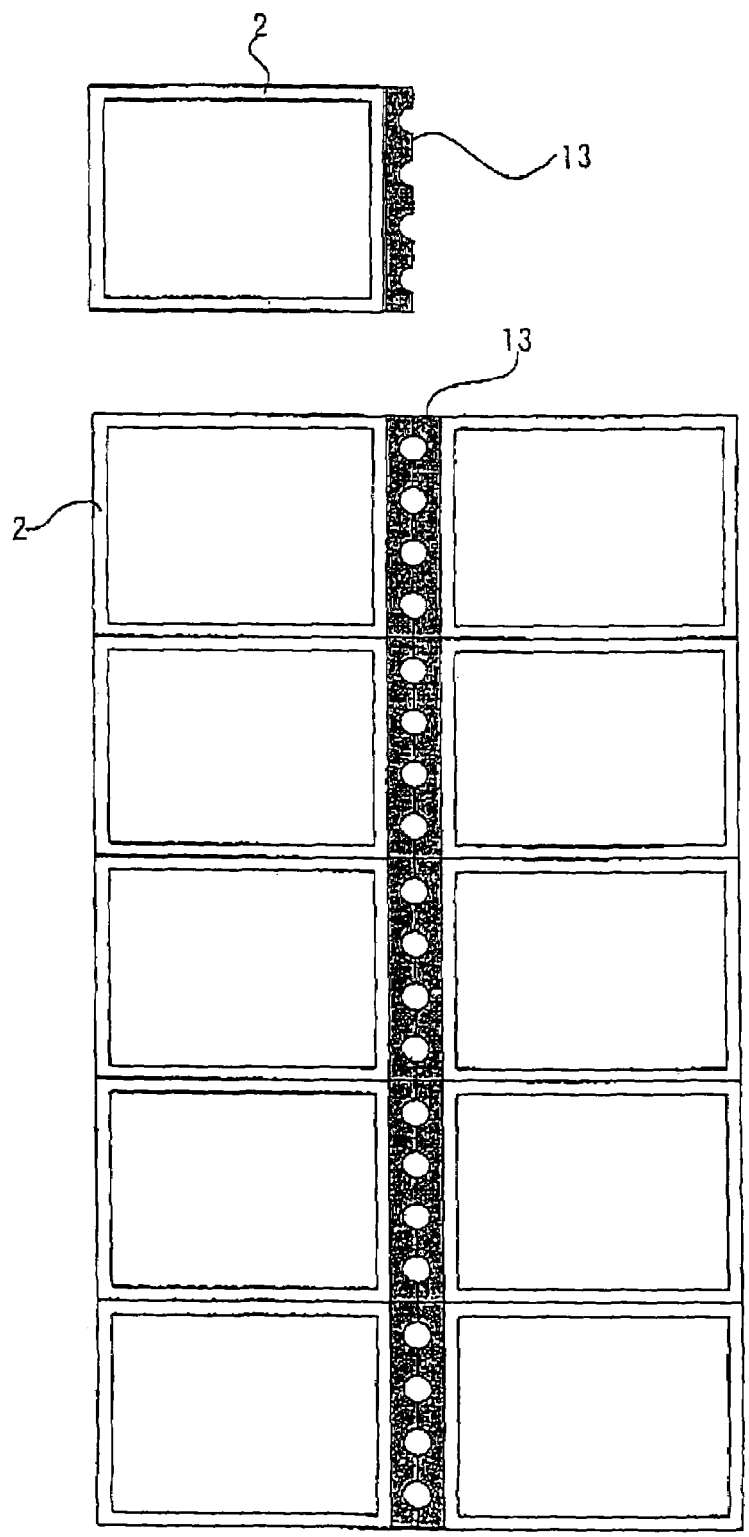
FIG. 15 is a diagram illustrating a second variation of the same.

Even when the previously mentioned lead frame is employed, backlights as blanks may be prepared with their molded cases 2 joined together in concatenation as shown in FIGS. 14 and 15 for subsequent separation from one another into finished products. Thus, the backlights can similarly be mass-produced easily.

As described in the foregoing, the backlight according to this embodiment uses unpackaged LED dies as its emissive means, whereby the backlight can be smaller and thinner in structure than the conventional backlights.

Although the case where the unpackaged LED dies are used as the emissive means has been described in the above examples, a so-called "chip LED" may also be used, wherein an LED die is attached to a small substrate. Even when such chip LEDs are used, the lead frame and the molded case are integrally molded as described above, and this eliminates the need for connecting the dies to the leads as required in the conventional method. Hence, operating efficiency can be improved.

Further, the case where the light guide means is formed by filling the hollow space with a transparent or semitransparent resin have been described in this embodiment. This technique is well suited to automation, and also increases the intensity of light of the emissive section owing to refraction provided by the resin.

Still further, limiting resistors may be attached directly to the lead frame, whereby the limiting resistors can be eliminated from a printed board for mounting the backlight 100.

The above-described embodiments and examples of the present invention are to be considered only as illustrative and not restrictive, and hence the location and number of the LEDs, the shape of the molded case, etc. can be modified whenever appropriate.

The invention may be embodied in other specific forms without departing from the spirit or essential characteristics thereof. The present embodiments are therefore to be considered in all respects as illustrative and not restrictive, the scope of the invention being indicated by the appended claims rather than by the forgoing description and all changes which come within the meaning and range of equivalency of the claims are therefore intended to be embraces therein.

The entire disclosure of Japanese Patent Application No. 2000-278104 filed on Sep. 13, 2000 including the specification, claims, drawings and summary is incorporated herein by reference in its entirety.

What is claimed is:

1. A surface-emitting backlight comprising:
a molded case made of a resin and provided with a hollow space having at least one inner surface serving as a reflective surface;
a contact member for contact with emissive means integrally molded with said molded case such that conductive contacts of said contact member are exposed to an interior of said hollow space;
emissive means arranged on at least one of said conductive contacts; and
light guide means for covering said interior of said hollow space substantially evenly,
wherein said at least one inner surface of said hollow space of said molded case is roughened for diffusion of light,
wherein said emissive means is arranged so as to emit light in a direction vertical to an emissive surface of said surface-emitting backlight, and
wherein said emissive means is arranged at one or both ends of an emissive region of said emissive surface, and
wherein reflecting means for reflecting light from said emissive means to a substantially area of said emissive region is arranged above said emissive means.

2. A surface-emitting blacklight comprising:
a molded case made of a resin and provided with a hollow space having at least one inner surface serving as a reflective surface;
a contact member for contact with emissive means integrally molded with said molded case such that conductive contacts of said contact member are exposed to an interior of said hollow space;
emissive means arranged on at least one of said conductive contacts; and
light guide means for covering said interior of said hollow space substantially evenly,
wherein said at least one inner surface of said hollow space of said molded case is roughened for diffusion of light,
wherein said emissive means is arranged so as to emit light in a direction vertical to an emissive surface of said surface-emitting backlight,
wherein said emissive means is arranged at one or both ends of an emissive region of said emissive surface, and wherein reflecting means for reflecting light from said emissive means to a substantially entire area of said emissive region is arranged above said emissive means.

3. A surface-emitting backlight according to claim 1, wherein said emissive means is a light-emitting semiconductor die.

4. A surface-emitting backlight according to claim 1, wherein a plurality of emissive means of different colors are arranged on said at least one of said conductive contacts.

* * * * *